US010707039B2

(12) United States Patent
Van Kampen et al.

(10) Patent No.: US 10,707,039 B2
(45) Date of Patent: Jul. 7, 2020

(54) CURRENT HANDLING IN LEGS AND ANCHORS OF RF-SWITCH

(71) Applicant: CAVENDISH KINETICS, INC., San Jose, CA (US)

(72) Inventors: Robertus Petrus Van Kampen, S-Hertogenbosch (NL); Richard L. Knipe, McKinney, TX (US)

(73) Assignee: Cavendish Kinetics, Inc., San Jose, CA (US)

(*) Notice: Subject to any disclaimer, the term of this patent is extended or adjusted under 35 U.S.C. 154(b) by 142 days.

(21) Appl. No.: 15/771,038

(22) PCT Filed: Nov. 14, 2016

(86) PCT No.: PCT/US2016/061935
§ 371 (c)(1),
(2) Date: Apr. 25, 2018

(87) PCT Pub. No.: WO2017/087340
PCT Pub. Date: May 26, 2017

(65) Prior Publication Data
US 2018/0315572 A1  Nov. 1, 2018

Related U.S. Application Data

(60) Provisional application No. 62/255,992, filed on Nov. 16, 2015.

(51) Int. Cl.
H01L 27/14      (2006.01)
H01H 59/00     (2006.01)
(Continued)

(52) U.S. Cl.
CPC ....... *H01H 59/0009* (2013.01); *B81B 7/0006* (2013.01); *B81C 1/00166* (2013.01);
(Continued)

(58) Field of Classification Search
CPC .......... H01L 23/3121; H01L 23/49811; H01L 23/49833
See application file for complete search history.

(56) References Cited

U.S. PATENT DOCUMENTS 6,906,905 B1    6/2005  Chinthakindi
9,443,658 B2*   9/2016  Van Kampen ........... H01G 5/18
(Continued)

FOREIGN PATENT DOCUMENTS

CN    103155069 A      6/2013
WO    2013033526 A2    3/2013
WO    2015017743 A1    2/2015

OTHER PUBLICATIONS

Office Action issued in corresponding Chinese Patent Application No. 201680066443.8, dated Feb. 27, 2019 (19 pages).
(Continued)

*Primary Examiner* — Phuc T Dang
(74) *Attorney, Agent, or Firm* — Withrow & Terranova, P.L.L.C.

(57) ABSTRACT

The present invention generally relates to a mechanism for making the anchor of the MEMS switch more robust for current handling. The disclosure includes a modified leg and anchor design that allows for larger currents to be handled by the MEMS switch.

20 Claims, 11 Drawing Sheets

(51) Int. Cl.
  *H01G 5/38*  (2006.01)
  *B81B 7/00*  (2006.01)
  *B81C 1/00*  (2006.01)
  *H01G 5/16*  (2006.01)
  *H01H 1/00*  (2006.01)

(52) U.S. Cl.
  CPC ............ *H01G 5/38* (2013.01); *B81B 2201/01* (2013.01); *B81B 2203/0307* (2013.01); *B81B 2203/04* (2013.01); *B81B 2207/07* (2013.01); *H01G 5/16* (2013.01); *H01H 2001/0084* (2013.01); *H01H 2203/026* (2013.01)

(56) References Cited

U.S. PATENT DOCUMENTS

2006/0003482 A1  1/2006  Chinthakindi et al.
2013/0032453 A1*  2/2013  Troy ................... B81C 1/00484
                                                200/181
2014/0246740 A1*  9/2014  Van Den Hoek ... B81C 1/00293
                                                257/419

OTHER PUBLICATIONS

Search Report issued in corresponding Chinese Patent Application No, 2016800664438, dated Feb. 17, 2019 (3 pages).
International Search Report and Written Opinion dated Feb. 24, 2017, issued in corresponding application No. PCT/US2016/061935.
Office Action issued in corresponding Chinese Patent Application No. 2016800664438, dated Oct. 23, 2019 (17 pages).
Third Office Action for Chinese Patent Application No. 201680066443.8, dated Mar. 31, 2020, 17 page.

* cited by examiner

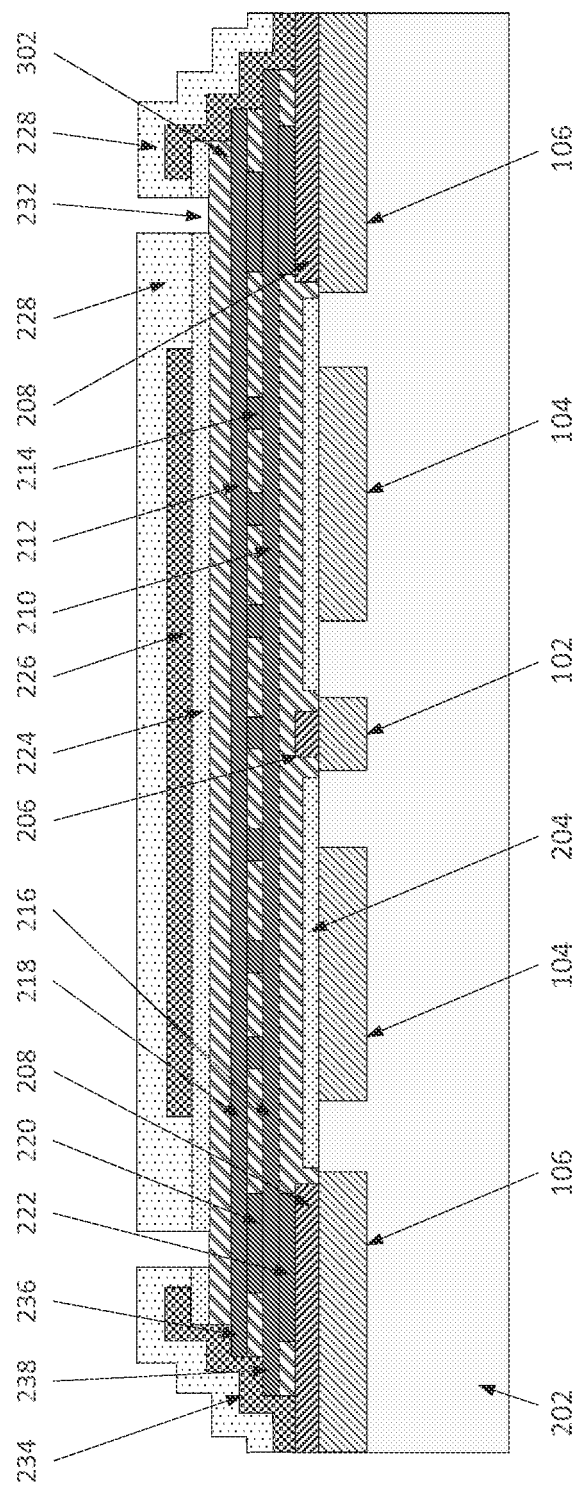

US 10,707,039 B2

CURRENT HANDLING IN LEGS AND ANCHORS OF RF-SWITCH

RELATED APPLICATIONS

This application is a 35 USC 371 national phase filing of International Application No. PCT/US2016/061935, filed Nov. 14, 2016, which claims the benefit of U.S. provisional patent application Ser. No. 62/255,992, filed Nov. 16, 2015, the disclosures of which are incorporated herein by reference in their entireties.

BACKGROUND OF THE DISCLOSURE

Field of the Disclosure

Embodiments of the present disclosure generally relate to a technique for improving the current handling of the legs and anchors in MEMS switches.

Description of the Related Art

A MEMS resistive switch contains a movable plate that moves by applying a voltage to an actuation electrode. Once the electrode voltage reaches a certain voltage, oftentimes referred to as a snap-in voltage, the plate moves towards the electrode. The plate moves back to the original position once the voltage is lowered to a release voltage. The release voltage is typically lower than the snap-in voltage due to the higher electrostatic forces when the plate is close to the actuation electrode and due to stiction between the plate and the surface to which the plate is in contact once moved closer to the electrode. The spring constant of the MEMS device sets the value of the pull in voltage and pull off voltage.

When the plate is actuated down, it lands on a contact electrode to which the plate makes an ohmic contact. The resulting current that is injected from the ohmic contact into the switch body runs out to the anchors of the switch through the leg-suspension and through the switch anchor vias.

This current causes a temperature rise in the legs by Joule heating and can lead to high temperatures causing unwanted thermal expansion leading to changes in the switching voltages or to phase changes in the alloy materials often used in the device fabrication. At the same time the current can cause failures in the vias used to anchor the MEMS device to the substrate.

Therefore, there is a need in the art for a MEMS switch that can carry large currents without leading to a destructive failure of the legs and the anchor vias.

SUMMARY OF THE DISCLOSURE

The present disclosure generally relates to a modified leg and anchor design that allows for larger currents to be handled by the MEMS switch.

In one embodiment, a MEMS device comprises a substrate having a plurality of electrodes disposed therein, wherein the plurality of electrodes include at least an anchor electrode, a pull-down electrode and an RF electrode; an insulating layer disposed over the substrate and the pull-down electrode; a switching element movable from a position spaced a first distance from the RF electrode and a second distance from the RF electrode that is different from the first distance, wherein the switching element includes: a bottom layer; a top layer; and a plurality of vias connecting the bottom layer to the top layer, wherein the switching element includes a first anchor portion, a first leg portion and a bridge portion, wherein the plurality of vias are disposed in the anchor portion and the bridge portion, wherein the anchor portion is coupled to the anchor electrode.

In another embodiment, a MEMS device comprises a substrate having a plurality of electrodes disposed therein, wherein the plurality of electrodes include at least an anchor electrode, a pull-down electrode and an RF electrode; an anchor contact disposed on the anchor electrode; an insulating layer disposed over the substrate and the pull-down electrode; a switching element movable from a position spaced a first distance from the RF electrode and a second distance from the RF electrode that is different from the first distance, wherein the switching element includes: a bottom layer; a top layer; and a plurality of vias connecting the bottom layer to the top layer, wherein the switching element is enclosed in a cavity; and a cavity sidewall in contact with the bottom layer, top layer, and anchor contact, wherein the cavity sidewall is electrically coupled to the bottom layer, top layer and anchor contact.

In another embodiment, a MEMS device comprises a substrate having a plurality of electrodes disposed therein, wherein the plurality of electrodes include at least an anchor electrode, a pull-down electrode and an RF electrode; an anchor contact disposed on the anchor electrode; an insulating layer disposed over the substrate and the pull-down electrode; a switching element movable from a position spaced a first distance from the RF electrode and a second distance from the RF electrode that is different from the first distance, wherein the switching element includes: a bottom layer; a top layer; and a plurality of vias connecting the bottom layer to the top layer, wherein the switching element includes a first anchor portion, a first leg portion and a bridge portion, wherein the plurality of vias are disposed in the anchor portion and the bridge portion, wherein the anchor portion is coupled to the anchor electrode; and a cavity sidewall in contact with the bottom layer, top layer, and anchor contact, wherein the cavity sidewall is electrically coupled to the bottom layer, top layer and anchor contact.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 3A-3G are schematic illustrations of a MEMS ohmic switch at various stages of fabrication according to one embodiment.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1A:
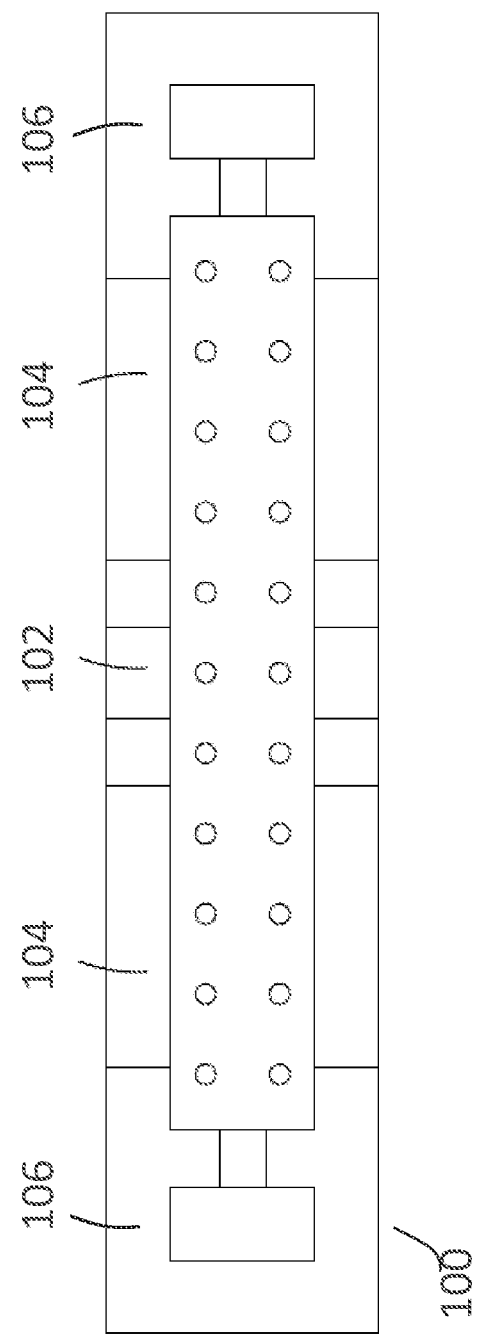
FIG. 1A is a schematic top-view of an ohmic MEMS switch.

FIG. 1A is a schematic top-view of an ohmic MEMS switch 100. The switch 100 contains an RF-electrode 102, pull-down electrodes 104 and anchor electrodes 106. When a sufficiently high voltage is applied to the pull-down electrodes 104, the MEMS switch is actuated down and forms an ohmic connection between the RF-electrode 102 and anchor electrodes 106

Figure 1B:
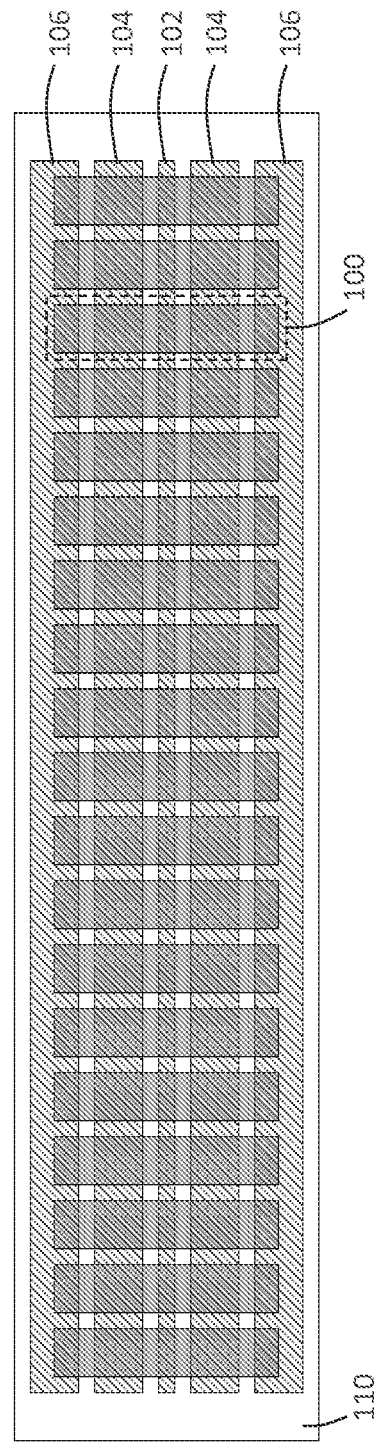
FIG. 1B is a schematic top view of an ohmic switch cell containing a number of parallel operated MEMS switches.

FIG. 1B is a schematic top view of an ohmic switch cell 110 containing a number of MEMS switches 100. All MEMS switches 100 in the cell 110 are turned on at the same time by applying a high-enough voltage on the pulldown-electrodes 104. Because many switches are operated in parallel, the resistance between the RF-electrode 102 and anchor electrodes 106 is reduced.

Figure 1C:
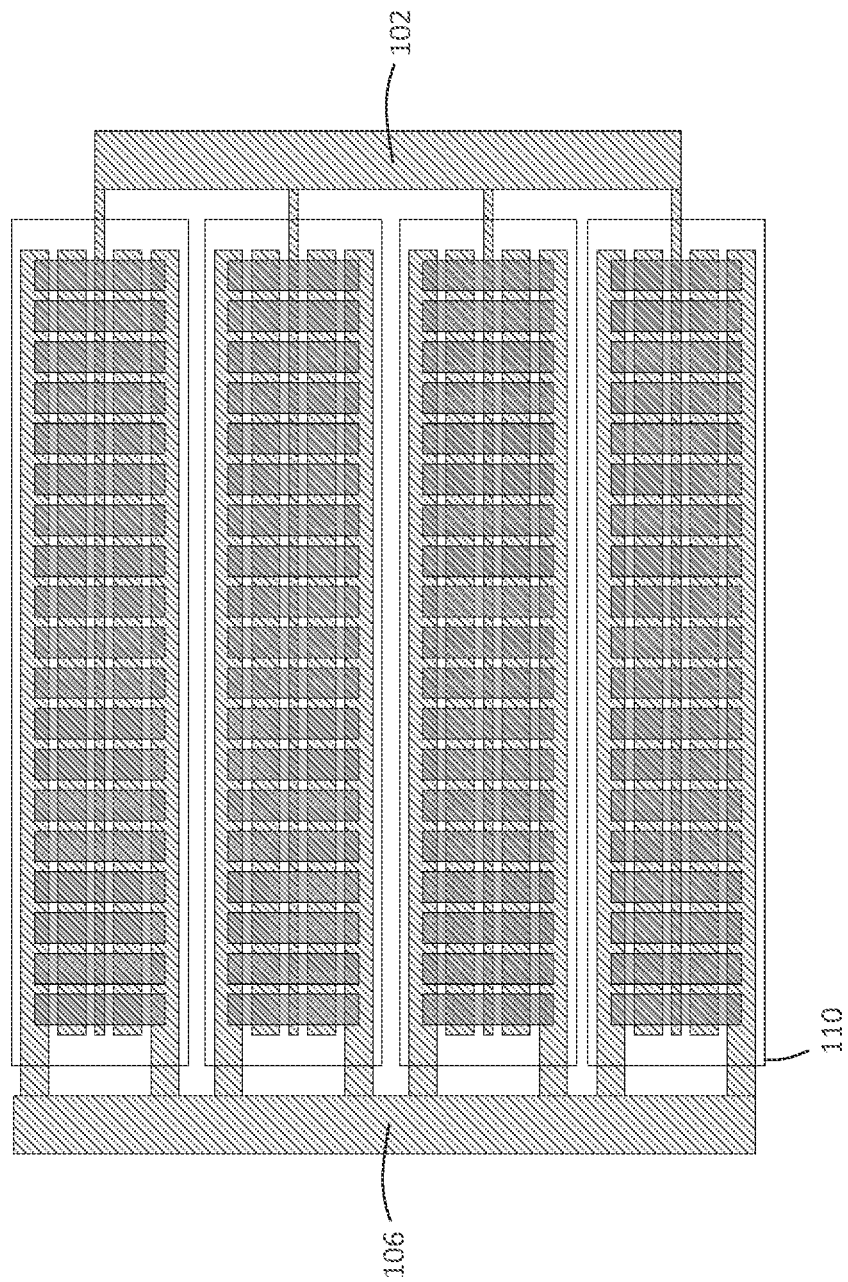
FIG. 1C is a schematic top view of an ohmic switch array containing a number of parallel operated switch-cells.

FIG. 1C shows a schematic top-view of an ohmic switch-array. It contains a number of parallel operated switch-cells 110. The RF-electrodes 102 of each cell are connected together at one end of each switch-cell 110, while the anchor-electrodes 106 are connected together at the other end of each switch-cell 110. When all cells are turned on this results in a further reduction of the resistance between the RF-electrode 102 and anchor electrode 106. At the same time, because many switches are operated in parallel the total switch-array can handle more current.

Figure 2:
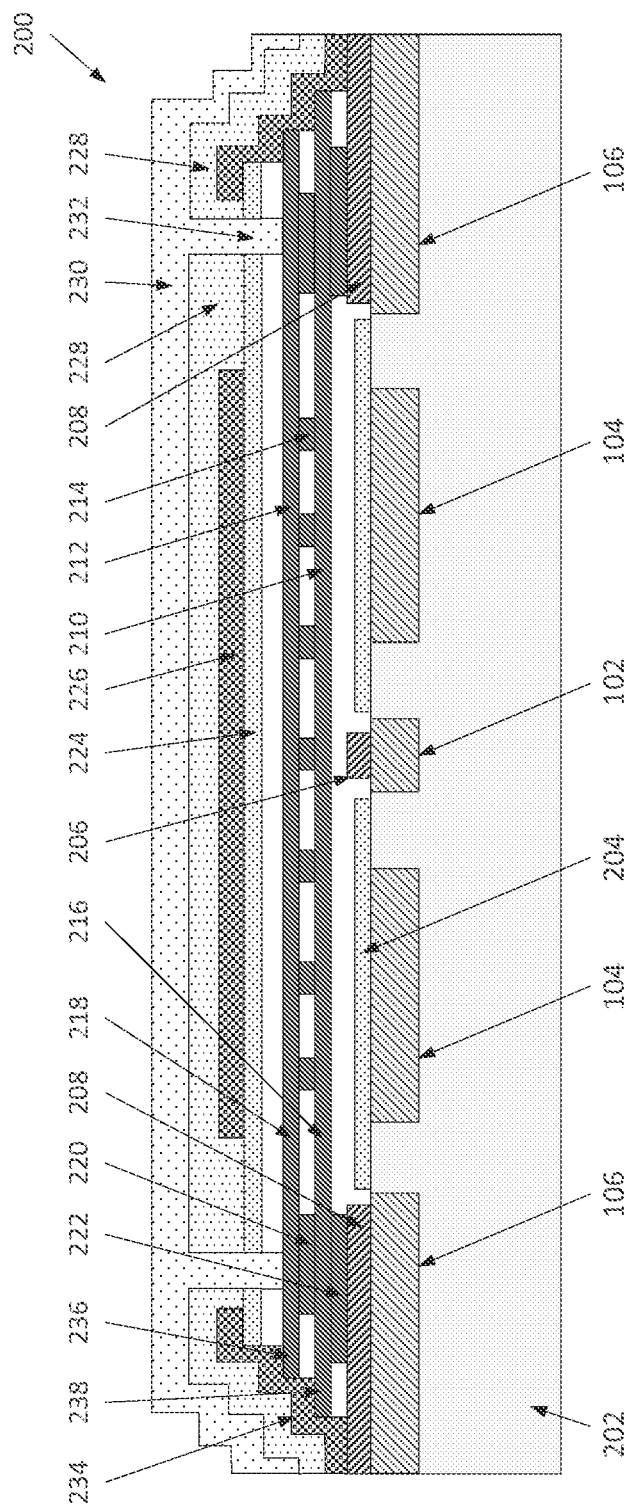
FIG. 2 is a schematic cross-sectional view of a MEMS ohmic switch according to one embodiment.

FIG. 2 shows a cross-section view of an ohmic MEMS switch 200. This disclosure describes a method of improving the current handling capability of the MEMS leg-suspension and anchor. The MEMS switch 200 contains an RF electrode 102, pull-down electrodes 104 and anchor electrodes 106 located on substrate 202. The pull-down electrodes 104 are covered with a dielectric layer 204 to avoid a short-circuit between the MEMS switch and the pull-down electrode 104 in the pulled-down state. Suitable materials for the electrically insulating or dielectric layer 204 include silicon based materials including silicon-oxide, silicon-dioxide, silicon-nitride and silicon-oxynitride. The thickness of this layer 204 is typically in the range of 50 nm to 150 nm to limit the electric field in the dielectric layer. On top of the RF electrode 102 is the RF contact 206 to which the switch body forms an ohmic contact in the pulled-down state. On top of the anchor-electrode 106 is the anchor contact 208 to which the MEMS device is anchored. Typical materials used for the contacting layers 206, 208 include Ti, TiN, TiAl, TiAlN, AlN, Al, W, Pt, Ir, Rh, Ru, $RuO_2$, ITO and Mo and combinations thereof.

The switch element contains a stiff bridge consisting of conductive layers 210, 212 which are joined together using an array of vias 214. This allows for a stiff plate-section and compliant legs to provide a high contact-force while keeping the operating voltage to acceptable levels. The MEMS bridge is suspended by legs 216 formed in the lower layer 210 and legs 218 formed in the upper layer 212 of the MEMS bridge. The upper layer of the MEMS bridge is anchor to the lower layer of the MEMS with via 220. The lower layer of the MEMS bridge is anchored to the anchor contact 208 with via 222. Current that is injected from the RF contact 206 into the MEMS bridge when the MEMS switch is actuated down flows out through the MEMS-bridge in both directions to the anchor electrodes 106 located on either side of the switch-body. The current handling of the switch is improved by using legs 216, 218 in both layers 210, 212 of the MEMS bridge instead of just a single layer. Because these legs are not joined together with vias 214 like in the MEMS-bridge the compliance of these legs is still low enough to allow for reasonable operating voltages to pull the MEMS bridge 210, 212 in contact with the RF contact 206.

Above the MEMS bridge there is a dielectric layer 224 which is capped with metal pull-up electrode 226 which is used to pull the MEMS up to the roof for the off state. Dielectric layer 224 avoids a short-circuit between the MEMS bridge and the pull-up electrode 226 in the actuated-up state and limits the electric fields for high reliability. Moving the device to the top helps reduce the capacitance of the switch to the RF-electrode 102 in the off state. The cavity roof further contains an additional dielectric layer 228 for mechanical strength. The cavity is sealed with dielectric layer 230 which fills the etch release holes 232 used to remove the sacrificial layers which are present during fabrication. The dielectric layer 230 enters the etch release holes 232 and provides a further mechanical support to the top-layer 212 of the MEMS-bridge in the anchors, while also sealing the cavity so that there is a low pressure environment in the cavity. Suitable materials for the roof dielectric layers 228, 230 include silicon based materials including silicon-oxide, silicon-dioxide, silicon-nitride and silicon-oxynitride.

The same conductive layer which is used for the pull-up electrode 226 is also used at the sides of the cavity at 234 where it connects to the top-layer 212 of the MEMS-bridge at 236, to the bottom-layer 210 of the MEMS-bridge at location 238 and to the anchor contact 208. Thus this sidewall electrical connection provides for a current path from the MEMS bridge 210, 212 to the anchor contact 208 in parallel with the MEMS-bridge vias 220, 222 and increases the current handling capability of the MEMS anchor.

Figure 3A:
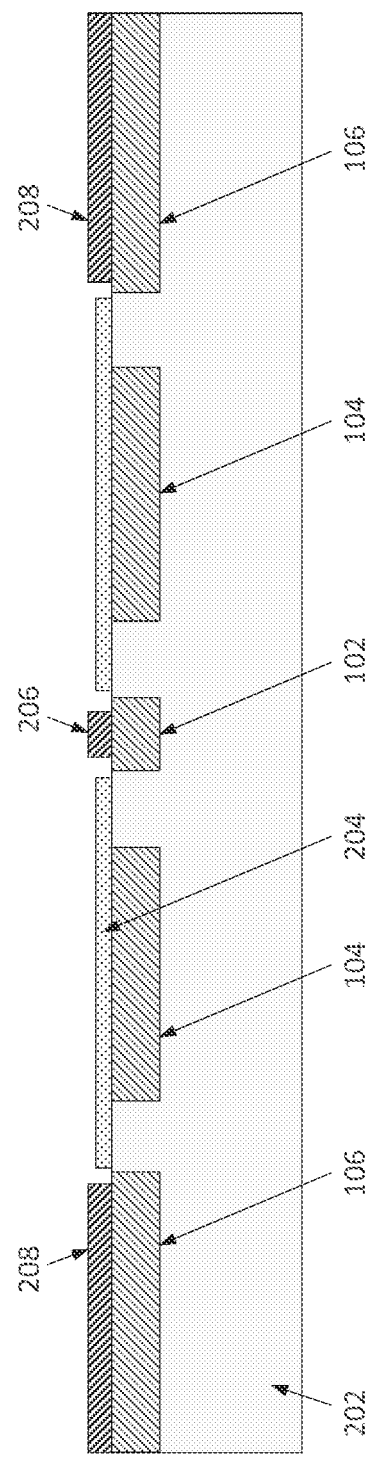

FIGS. 3A-3H are schematic illustrations of the MEMS ohmic switch 200 at various stages of fabrication according to one embodiment. FIG. 3A shows the backplane starting material of the MEMS-switch and contains a substrate 202 with a plurality of electrodes including the RF electrode 102, pull-in electrodes 104 and the anchor electrodes 106. It is to be understood that the substrate 202 may comprise a single layer substrate or a multi-layer substrate such as a CMOS substrate having one or more layers of interconnects. Additionally, suitable materials that may be used for the electrodes 102, 104, 106 include titanium-nitride, aluminum, tungsten, copper, titanium, and combinations thereof including multi-layer stacks of different material. The pull-down electrodes 104 are covered with an electrically insulating layer 204. Suitable materials for the electrically insulating layer 204 include silicon based materials including silicon-oxide, silicon-dioxide, silicon-nitride and silicon-oxynitride. On top of the RF-electrode is RF contact 206 and on top of the anchor electrode 106 is anchor contact 208. Typical materials used for the contacts 206, 208 include Ti, TiN, TiAl, TiAlN, AlN, Al, W, Pt, Ir, Rh, Ru, $RuO_2$, ITO and Mo and combinations thereof.

Figure 3B:
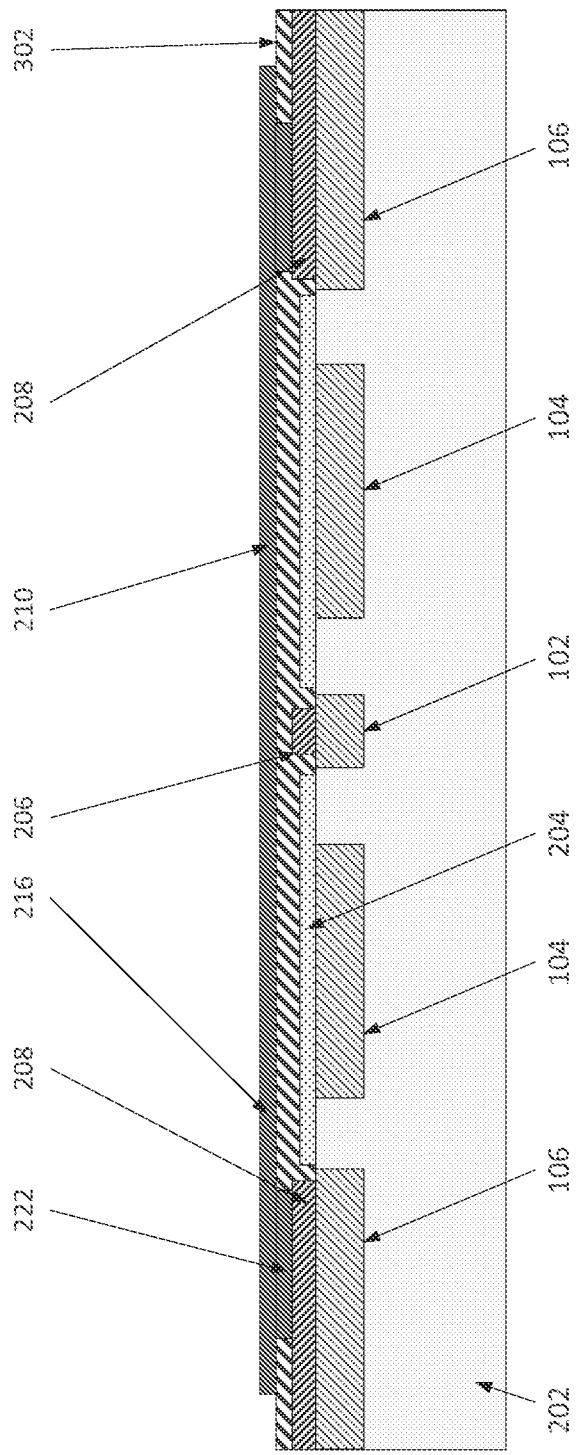

FIG. 3B shows the lower layer 210 of the MEMS bridge which is formed on the backplane by depositing a sacrificial layer 302, opening vias 222 in the sacrificial layer 302 and depositing and patterning the lower bridge portion including the legs at 216. The MEMS bridge is anchored to the anchor contact 208 with via 222.

Figure 3C:
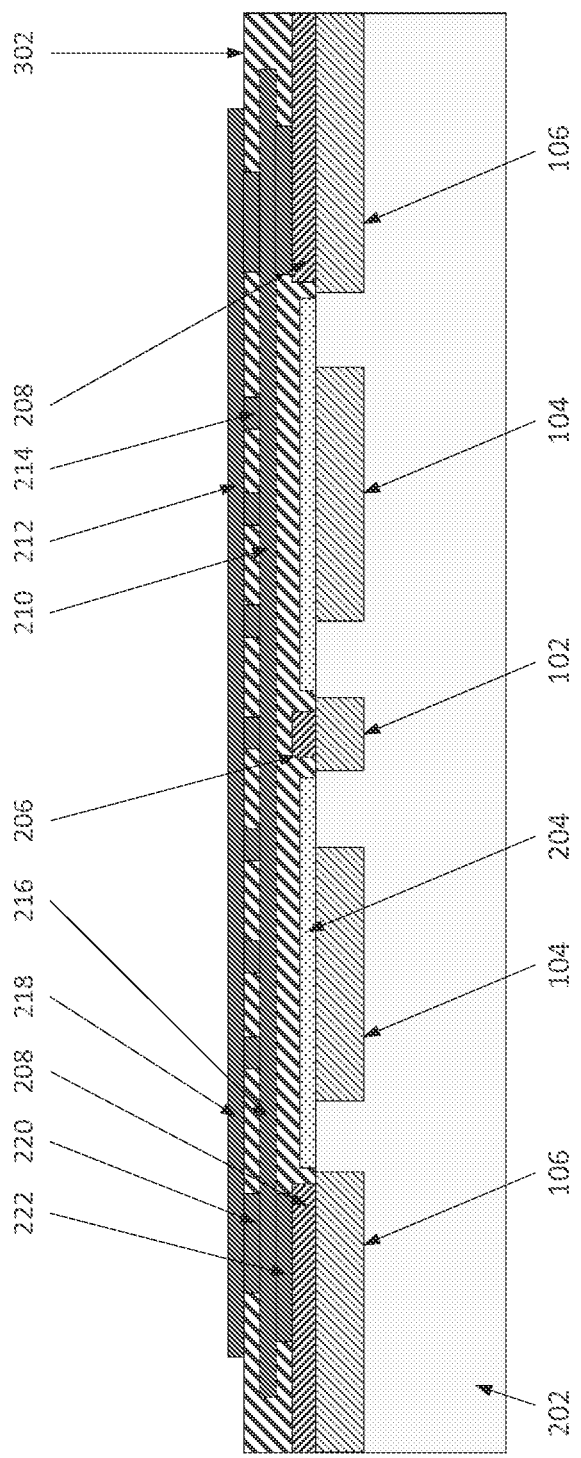

FIG. 3C shows the formation of the upper layer 212 of the MEMS bridge. Additional sacrificial material 302 is deposited and openings are generated in in the locations of vias 220, 214 which land on the lower MEMS bridge 210. The upper MEMS bridge is deposited and patterned to create the full MEMS-bridge 210, 212 joined together by vias 214, containing legs 216, 218 and anchor vias 220, 222

Figure 3D:
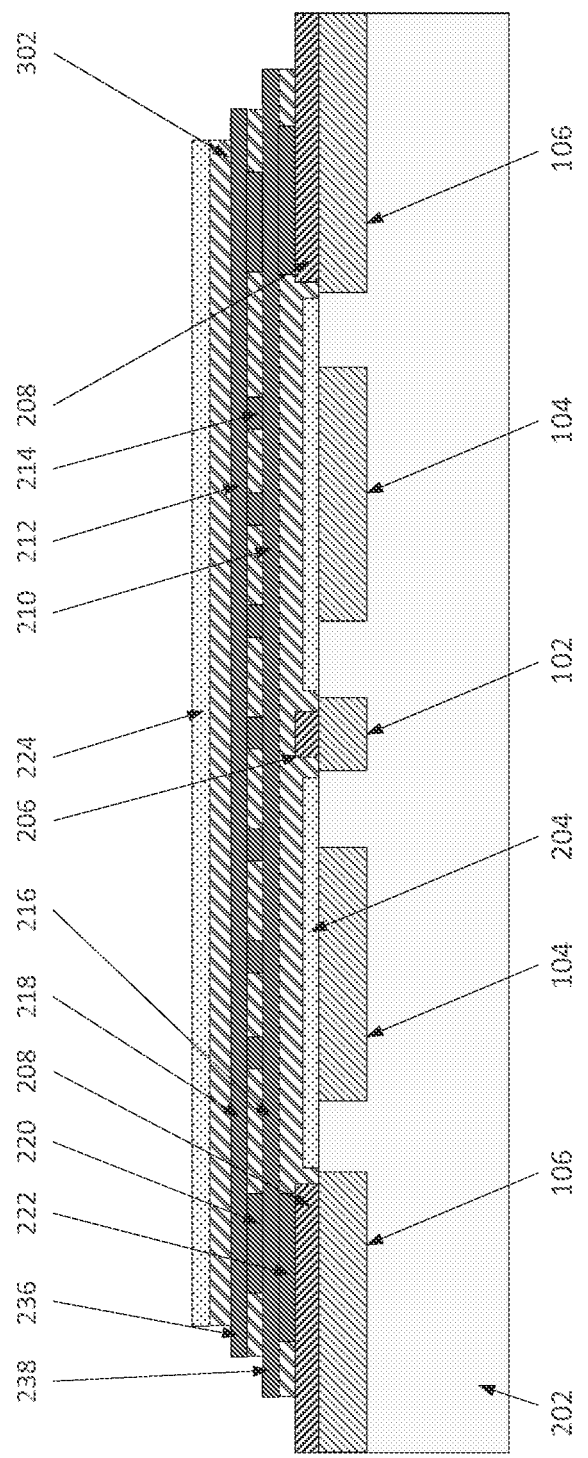

FIG. 3D shows the formation of the pull-up electrode by depositing additional sacrificial material 302 and an insulating dielectric layer 224. Suitable materials for the electrically insulating layer 224 include silicon based materials including silicon-oxide, silicon-dioxide, silicon-nitride and silicon-oxynitride. The dielectric layer 224 and sacrificial material 302 are patterned to form the cavity outline, thereby exposing portions 238 of the lower MEMS-bridge layer and 236 of the upper MEMS-bridge layer as well as a portion of the anchor contact layer 208.

Figure 3E:
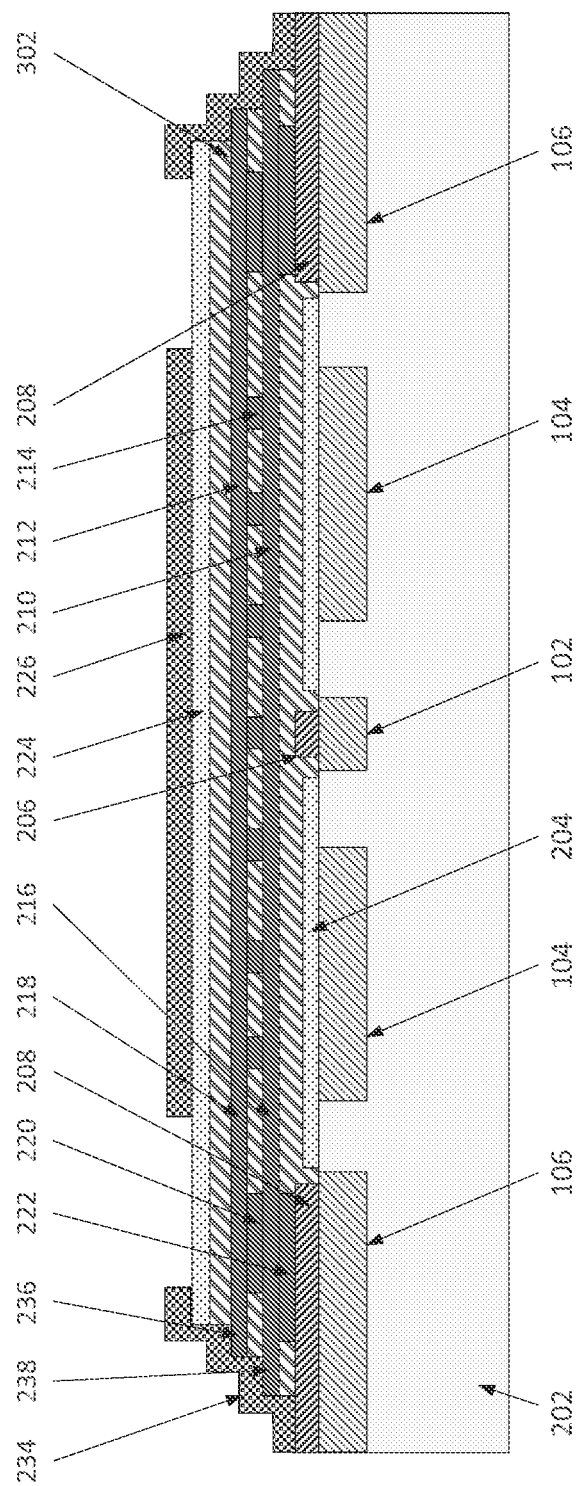

FIG. 3E shows the formation of the pull-up electrode 226 as well as the sidewall electrical connections 234, which connects to the exposed portions 236 of the upper MEMS-bridge layer, to exposed portions 238 of the lower MEMS-bridge layer and to the anchor contact 208, thus providing an additional current path from the MEMS bridge 210, 212 to the anchor contact 208 in parallel with the anchor vias 220, 222.

FIG. 3F shows the formation of the cavity roof, by depositing a dielectric material 228. Suitable materials for the electrically insulating layer 228 include silicon based materials including silicon-oxide, silicon-dioxide, silicon-nitride and silicon-oxynitride. This layer provides additional mechanical strength to the roof. Etch release holes 232 are opened which exposes the sacrificial material in the cavity.

Figure 3G:
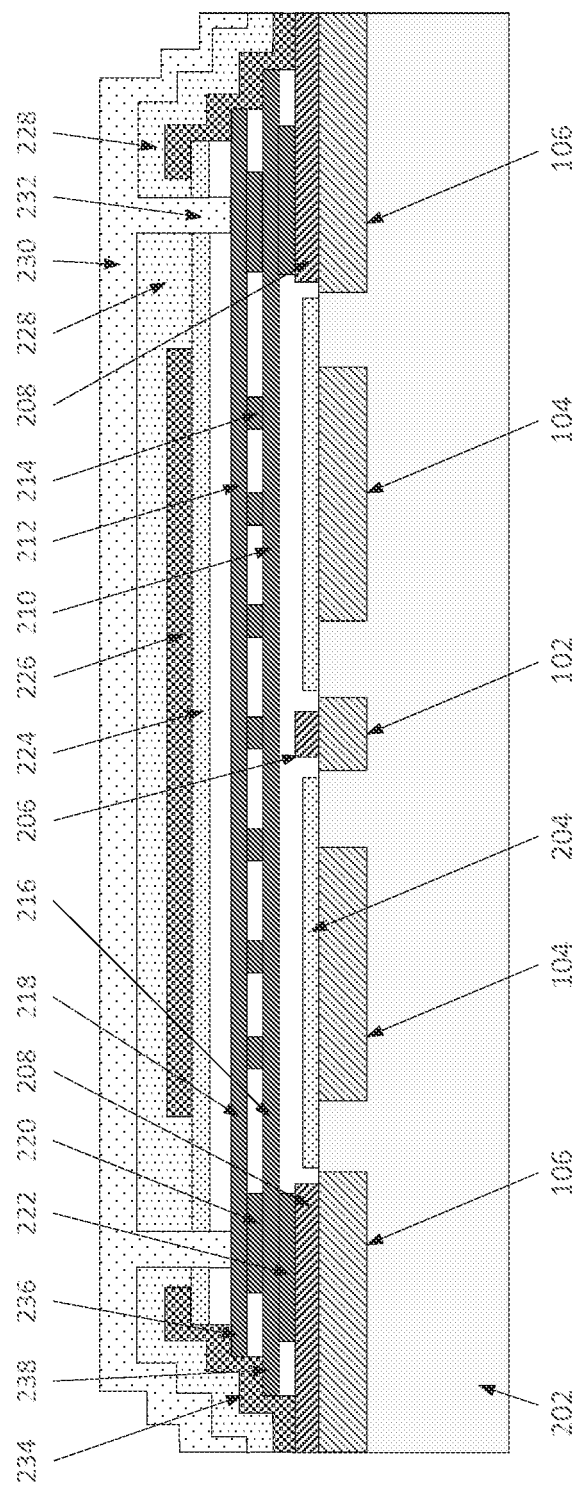

FIG. 3G shows the MEMS switch after the sacrificial layer has been removed through the release holes 232 and sealed with dielectric layer 230. The dielectric layer 230 also is deposited inside the etch release holes 232 and lands on upper MEMS bridge layer 212 providing additional mechanical strength to the anchors.

By extending the top layer of the switching element bridge all the way to the anchor area, the anchor area has a greater mechanical strength. Furthermore, there is an additional current path to the anchor electrode through the top layer of the switching element which increases the current handling capacity of the anchor.

While the foregoing is directed to embodiments of the present disclosure, other and further embodiments of the disclosure may be devised without departing from the basic scope thereof, and the scope thereof is determined by the claims that follow.

The invention claimed is:

1. A MEMS device, comprising:
a substrate having a plurality of electrodes disposed therein, wherein the plurality of electrodes include at least an anchor electrode, a pull-down electrode and an RF electrode;
an insulating layer disposed over the substrate and the pull-down electrode;
a switching element movable from a position spaced a first distance from the RF electrode and a second distance from the RF electrode that is different from the first distance, wherein the switching element includes:
a bottom layer;
a top layer; and
a plurality of vias connecting the bottom layer to the top layer, wherein the switching element includes a first anchor portion, a first leg portion and a bridge portion, wherein the plurality of vias are disposed in the first anchor portion and the bridge portion, wherein the first anchor portion is coupled to the anchor electrode.

2. The MEMS device of claim 1, wherein the first anchor portion includes a portion of the bottom layer, a portion of the top layer, at least one first via connecting the top layer to the bottom layer, and at least one second via connecting the bottom layer to the anchor electrode.

3. The MEMS device of claim 2, further comprising an anchor contact disposed between the anchor electrode and the at least one second via.

4. The MEMS device of claim 3, further comprising a dielectric layer coupled to a top surface of the top layer.

5. The MEMS device of claim 4, wherein the anchor electrode, the anchor contact, the at least one second via, the bottom layer, the at least one first via, and the top layer are all vertically aligned when viewed from a cross-sectional view.

6. The MEMS device of claim 5, wherein the plurality of electrodes include a second anchor electrode.

7. The MEMS device of claim 6, wherein the switching element includes a second anchor portion and wherein the second anchor portion includes a portion of the bottom layer, a portion of the top layer, the at least one first via connecting the top layer to the bottom layer, and the at least one second via connecting the bottom layer to the second anchor electrode.

8. A MEMS device comprising:
a substrate having a plurality of electrodes disposed therein, wherein the plurality of electrodes include at least an anchor electrode, a pull-down electrode and an RF electrode;
an anchor contact disposed on the anchor electrode;
an insulating layer disposed over the substrate and the pull-down electrode;
a switching element movable from a position spaced a first distance from the RF electrode and a second distance from the RF electrode that is different from the first distance, wherein the switching element includes:
a bottom layer;
a top layer; and
a plurality of vias connecting the bottom layer to the top layer, wherein the switching element is enclosed in a cavity; and
a cavity sidewall in contact with the bottom layer, the top layer, and the anchor contact, wherein the cavity sidewall is electrically coupled to the bottom layer, the top layer, and the anchor contact.

9. The MEMS device of claim 8, wherein the plurality of electrodes include a second anchor electrode.

10. The MEMS device of claim 9, wherein a second anchor contact is disposed on the second anchor electrode, wherein the cavity sidewall is in contact with the bottom layer, the top layer, and the second anchor contact.

11. The MEMS device of claim 10, further comprising a via connecting the bottom layer to the anchor contact.

12. A MEMS device, comprising:
a substrate having a plurality of electrodes disposed therein, wherein the plurality of electrodes include at least an anchor electrode, a pull-down electrode and an RF electrode;
an anchor contact disposed on the anchor electrode;
an insulating layer disposed over the substrate and the pull-down electrode;
a switching element movable from a position spaced a first distance from the RF electrode and a second distance from the RF electrode that is different from the first distance, wherein the switching element includes:
a bottom layer;
a top layer; and a plurality of vias connecting the bottom layer to the top layer, wherein the switching element includes a first anchor portion, a first leg portion and a bridge portion, wherein the plurality of vias are disposed in the first anchor portion and the bridge portion, wherein the anchor portion is coupled to the anchor electrode; and a cavity sidewall in contact with the bottom layer, the top layer, and the anchor contact, wherein the cavity sidewall is electrically coupled to the bottom layer, the top layer, and the anchor contact.

13. The MEMS device of claim 12, wherein the first anchor portion includes a portion of the bottom layer, a portion of the top layer, at least one first via connecting the top layer to the bottom layer, and at least one second via connecting the bottom layer to the anchor electrode.

14. The MEMS device of claim 13, further comprising the anchor contact disposed between the anchor electrode and the at least one second via.

15. The MEMS device of claim 14, further comprising a dielectric layer coupled to a top surface of the top layer.

16. The MEMS device of claim 15, wherein the anchor electrode, the anchor contact, the at least one second via, the bottom layer, the at least one first via, and the top layer are all vertically aligned when viewed from a cross-sectional view.

17. The MEMS device of claim 16, wherein the plurality of electrodes include a second anchor electrode.

18. The MEMS device of claim 17, wherein the switching element includes a second anchor portion and wherein the second anchor portion includes a portion of the bottom layer, a portion of the top layer, at least one first via connecting the top layer to the bottom layer, and at least one second via connecting the bottom layer to the second anchor electrode.

19. The MEMS device of claim 12, wherein the plurality of electrodes include a second anchor electrode.

20. The MEMS device of claim 19, wherein a second anchor contact is disposed on the second anchor electrode, wherein the cavity sidewall is in contact with the bottom layer, the top layer, and the second anchor contact.

* * * * *